United States Patent [19]

Tamura

[11] Patent Number: 5,164,811
[45] Date of Patent: Nov. 17, 1992

[54] SEMICONDUCTOR INTEGRATED CIRCUIT WITH VARYING CHANNEL WIDTHS

[75] Inventor: Tsuyoshi Tamura, Suwa, Japan

[73] Assignee: Seiko Epson Corporation, Tokyo, Japan

[21] Appl. No.: 688,730

[22] Filed: Apr. 19, 1991

[30] Foreign Application Priority Data

Apr. 20, 1990 [JP] Japan .................................. 2-104794

[51] Int. Cl.$^5$ ...................... H01L 27/02; H01L 27/10
[52] U.S. Cl. ..................................... 257/206; 257/207
[58] Field of Search ........................ 357/40, 41, 42, 45

[56] References Cited

U.S. PATENT DOCUMENTS 5,038,192  8/1991  Bonneau et al. ...................... 357/45

FOREIGN PATENT DOCUMENTS 0114491  1/1984  European Pat. Off. .
0344055  11/1989  European Pat. Off. .

*Primary Examiner*—Rolf Hille
*Assistant Examiner*—Wael Fahmy
*Attorney, Agent, or Firm*—W. Douglas Carothers, Jr.

[57] ABSTRACT

A semiconductor circuit has a logic cell comprising insulation gate type transistors wherein the structure of the cell can be easily corrected or changed improving the overall operational speed of the logic circuit produced while controlling the electrical power consumption of the circuit from being significantly increase. Input transistors and output transistors in a logic circuit layout employing the basic cell configuration of this invention are arranged at regular intervals along the power supply buses so that each channel width of the transistors is at right angles to these power wirings and the channel widths, $W_I(W_{IP}, W_{IN})$, of the input transistors of the circuit are formed to be narrower than the channel widths, $W_O(W_{OP}, W_{ON})$, of the output transistors of the circuit. In cases where n number of input transistors are connected in series, it is desirable to widen the channel width of the input transistors as the number of serially connected input transistors increases according to the correlation function, $W_I = K(W_O, n)$.

5 Claims, 7 Drawing Sheets

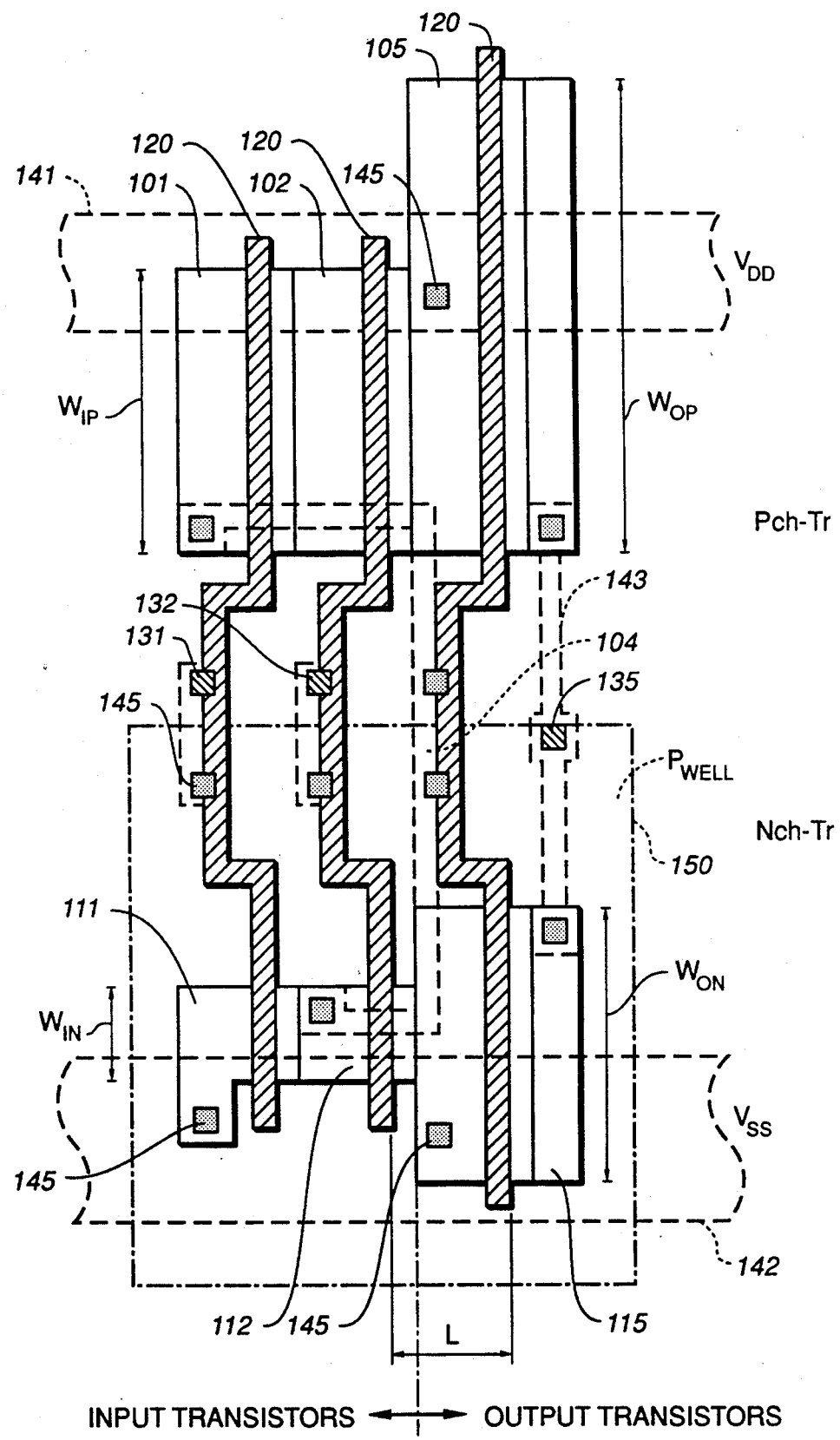
FIG._1

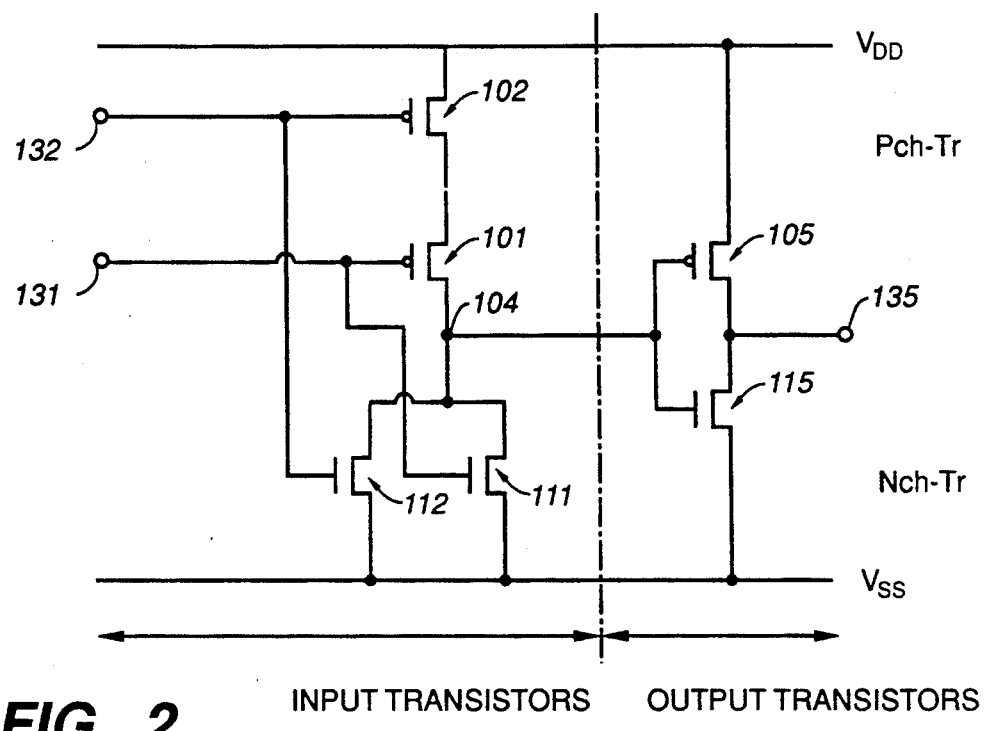
FIG._2
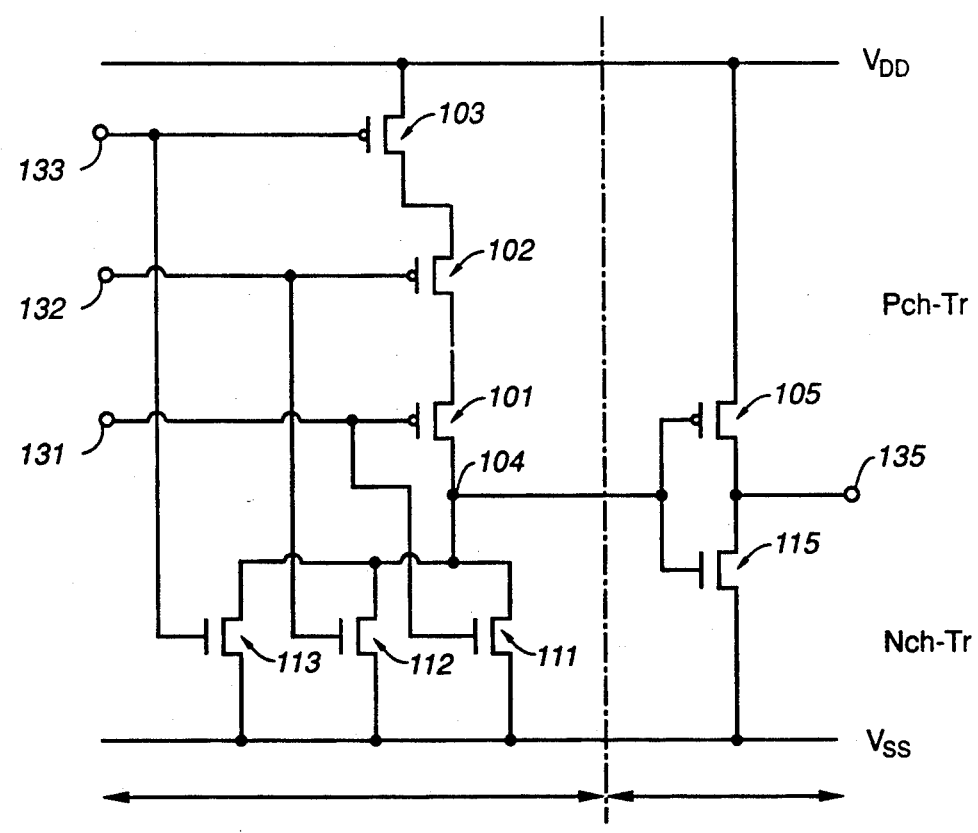
FIG._4

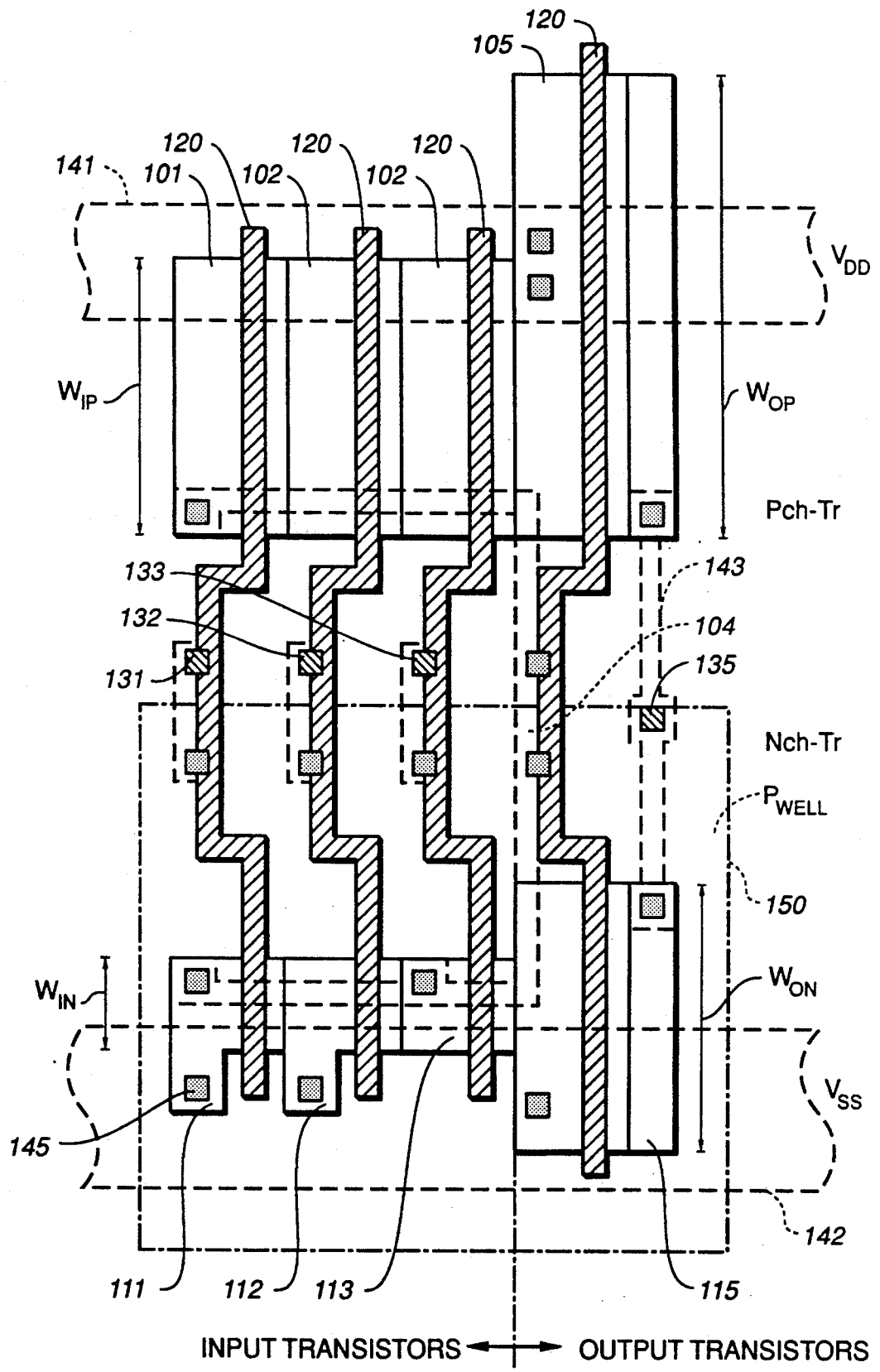
FIG._3

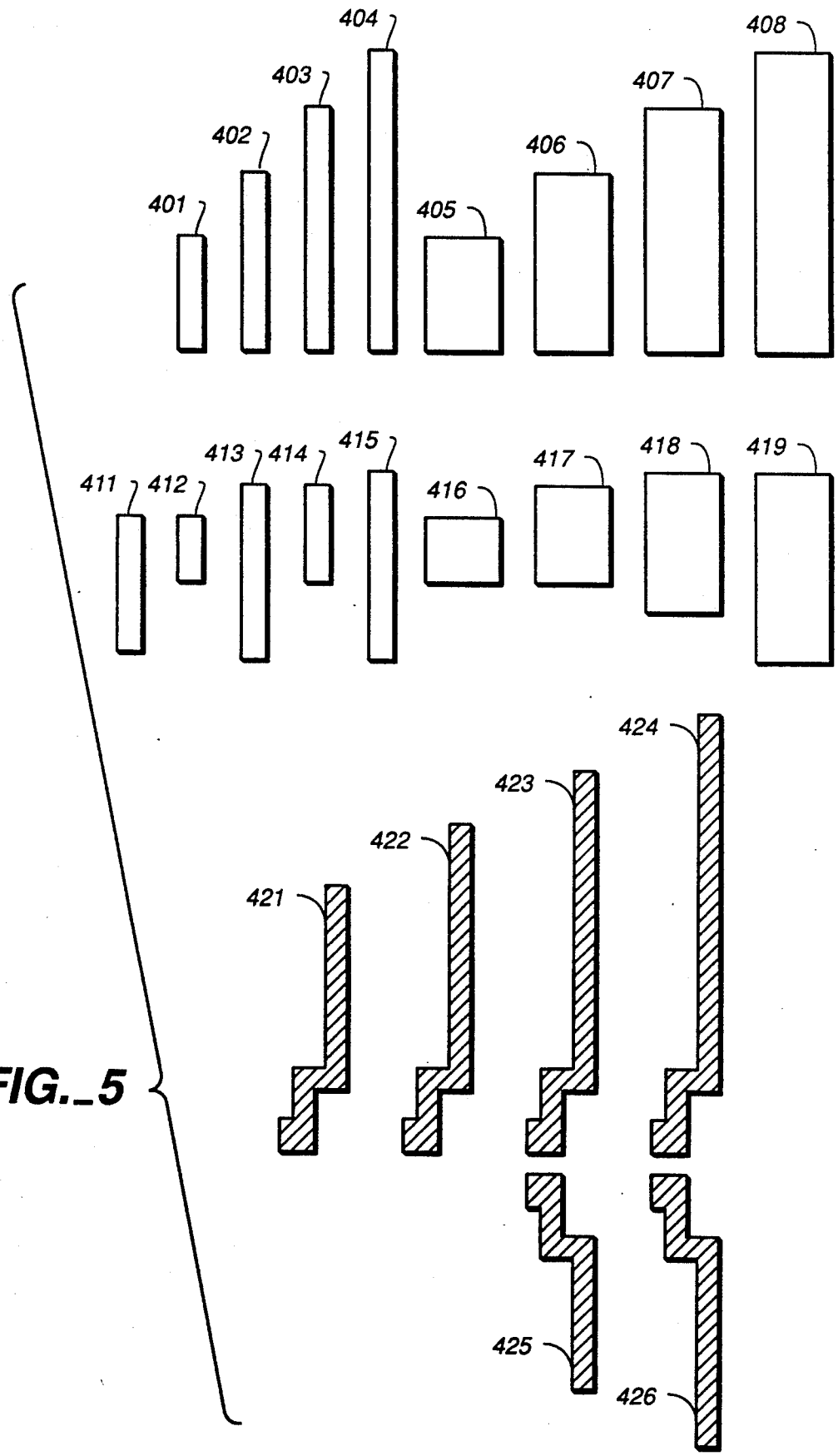
FIG._5

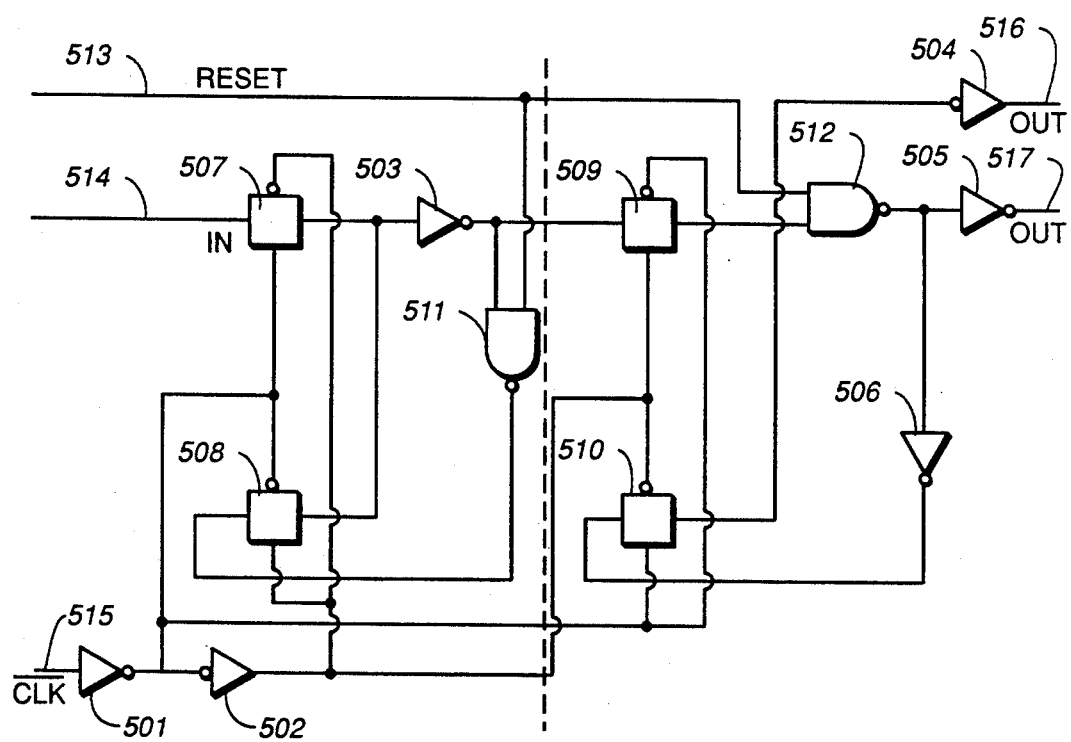
FIG._6

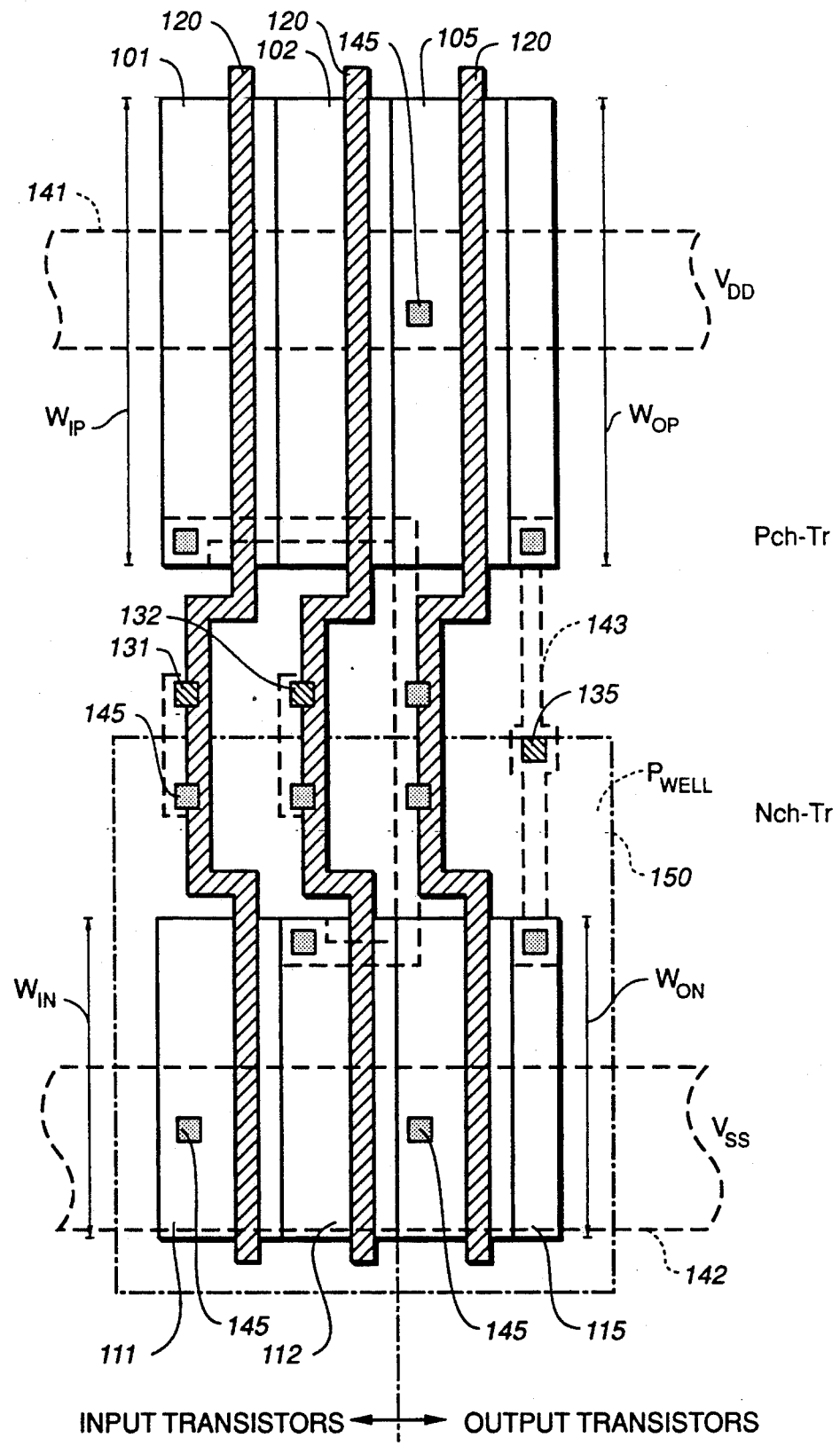
FIG._7
(PRIOR ART)

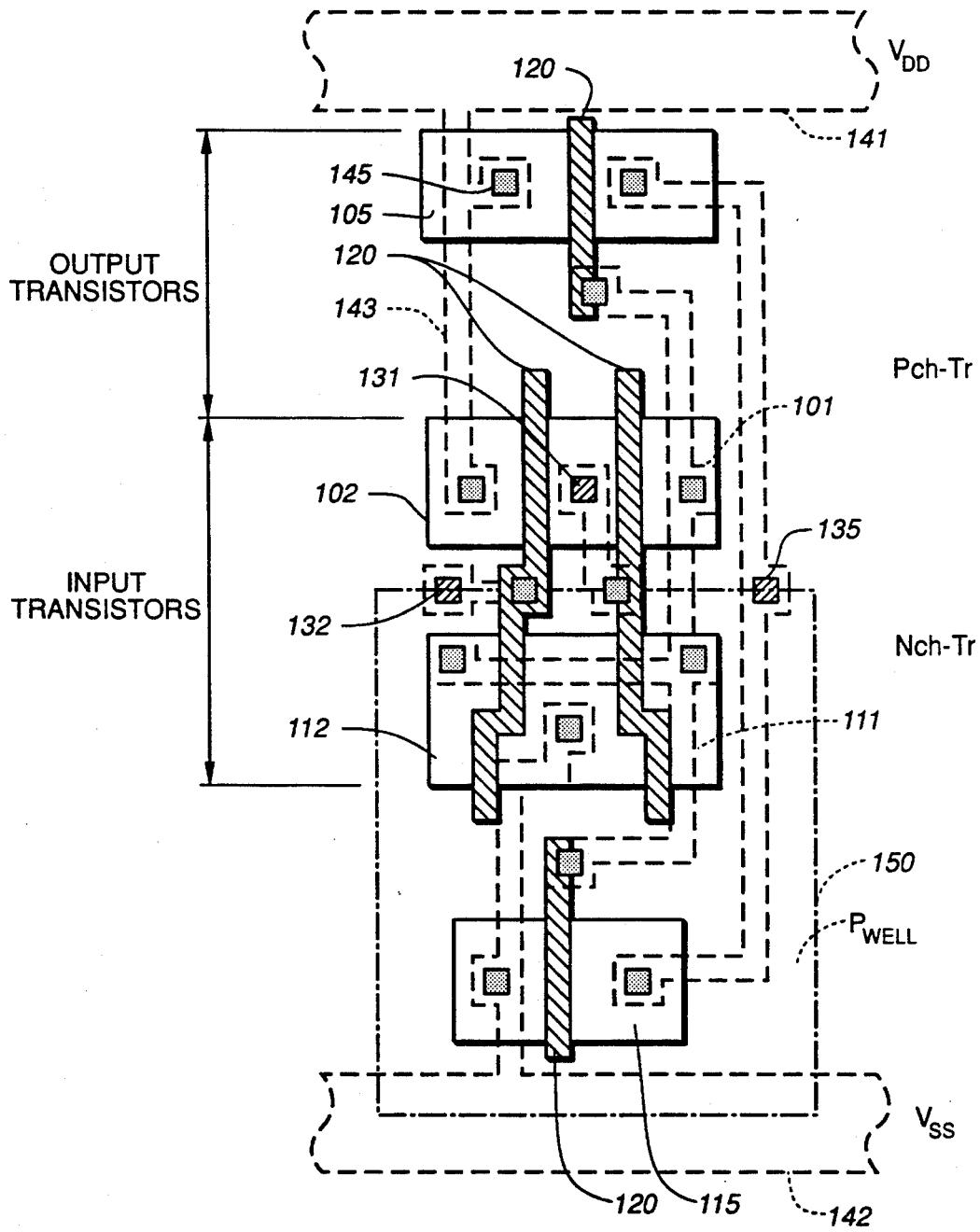
FIG._8
*(PRIOR ART)*

SEMICONDUCTOR INTEGRATED CIRCUIT WITH VARYING CHANNEL WIDTHS

BACKGROUND OF THE INVENTION

This invention relates generally to the arrangement and size of transistors in semiconductor integrated circuits comprising connected logic cells and more particularly to the construction of a standard logic cell in such circuit comprising insulated gate type transistors.

FIG. 2 illustrates a schematic diagram example of a conventional semiconductor integrated circuit, in this case an OR circuit, composed of standard logic cells of insulated gate type transistors formed by manual cell design per the cell layout shown in FIG. 8. In the OR circuit of FIG. 2, transistors 101, 102, 111 and 112 are input transistors while transistors 105, 115 are output transistors. Transistors 101, 102 and 105 are P-channel insulated gate type transistors (Pch-Tr) and 111, 112 and 115 are N-channel insulation gate type transistors (Nch-Tr).

The circuit of FIG. 2 is has two input terminals 131 and 132 to the gates of Pch-Tr transistors 101, 102 and Nch-Tr transistors 111, 112, wherein Pch-Tr transistors 101, 102 are connected in series at a node 104 to parallel connected transistors 111, 112 across power supply potentials, $V_{DD}$ and $V_{SS}$. Node 104 is connected to the gates of output transistors 105, 115 and output 135 from output transistors 105, 115 is connected to another cell or circuit in the integrated circuit via metal wiring.

FIG. 8 is a layout of the OR circuit shown in FIG. 2 formed through manual design principals wherein the input and output transistors are arranged between power bus, i.e., supply source potential, $V_{DD}$, and ground potential, $V_{SS}$, and formed in aligned rows or columns relative to aligned diffusion regions. Input transistors 101, 102 and output transistor 105 are P channel devices. Input transistors 111 and 112 and output transistor 115 are N channel devices and are formed in P well 150. Input pair terminals 131, 132 of the cell are connected to respective gate electrodes 120 of Pch-Tr's 101, 102, and Nch-Tr's 111, 112. The drains of output transistors 105, 115 are connected to output terminal 135. Thus, transistors 101-115, polysilicon gate electrodes 120, metal wiring 143 and contacts 145 together comprise the OR circuit shown in FIG. 2.

In order to enhance the operational speed of the logic circuit of the type shown in FIG. 2, it is necessary to widen the channel width, W, of the insulated gate type transistors. For example, the transition period, $t_r$, in voltage rise of the Pch-Tr's to their ON states can be approximated by the following expression:

$$t_r = 4 \cdot C / (\beta_{PO} \cdot W/n \cdot V_{DD}) \qquad (1)$$

where C is the load capacitance; $\beta_{PO}$, is the amplification factor in terms of electric current per unit length of the Pch-Tr; W is the channel width; n is the number of the serially connected input transistors; and $V_{DD}$ is the source potential. Since the transition period, $t_r$, is inversely proportional to the channel width, W, the transition period, $t_r$, can be shortened by widening the channel width, W.

In the conventional manual design construction shown in FIG. 8, however, it is necessary to shift transistors 105, 115 up or down in the cell in order to widen channel width, W, of transistors 101, 102, 105, 111, 112 and 115. Concurrently, it is also necessary to modify and rearrange metal wiring 143 and polysilicon gate electrodes 120. Furthermore, it is necessary to move and realign contact 145 of metal wiring 143 and polysilicon 120, as well as other contacts, and realign the contact through holes for the first and second metal layers. This requires additional design work within the set design rules and time checking the necessitated design modifications.

In recent years, there has been developed and adopted a gate array design method to more easily and quickly carry out the necessary modifications in a short period of time. An example of this gate array method is shown in the layout of FIG. 7 for the OR circuit shown in FIG. 2. In this gate array method, transistors of the same size are aligned horizontally relative to each cell so that the correction or changes to transistor channel width can be carried out by widening the channel width of transistors 101, 102, 105, 111, 112 and 115. In the case here, Pch-Tr's 101, 102 and 105 are of the same size and formed along or relative to power bus 141. Nch-Tr's 111, 112 and 115 are of the same size and formed along or relative to ground wiring 142 so that, as illustrated in FIG. 7, a uniformly shaped cell in a substantially aligned array is formed. As a result, the widening of the channel width of these transistors can be carried out in a flexible manner without much design change or correction required to the arrangement of the gate electrodes or the associated metal interconnect wiring.

This adopted gate array method, however, increases the electrical power consumption because the channel width of input transistors 101, 102, 111 and 112 widens as the channel width of output transistors 105 and 115 widens since these transistors are all of the same size. As a result, there is a corresponding increase in penetration current, $I_s$, which is the current created in charging and discharging of the transistors. For example, the penetrating current, $I_s$, of the Pch-Tr can be approximated by the following expression:

$$I_s = \tfrac{1}{2} \cdot \beta_{PO} \cdot W/n \cdot (V_{DD} - 2 \cdot V_{th})^2 \qquad (2)$$

where $V_{th}$ is the threshold voltage of the transistor and the other symbols in the expression are the same as those set forth in expression (1). As can been seen from expression (2), the penetrating current, $I_s$, increases as the channel width, W, is increased or becomes wider since the penetrating current, $I_s$, is proportional to channel width, W.

In particular, the increase in the operational speed of an integrated circuit depends on how much the cell transition time, $T_{trans}$, can be shortened. $T_{trans}$ is the time necessary for a signal to go from an output of a given cell to a next cell to which its output is connected. This time, $T_{trans}$, can be calculated on the basis of (1) the relation of the capacitance of the metal wiring connecting the given cell to the next cell, (2) the sum total of the parasitic capacitance, $C_L$, on the output of the given cell, such as, the capacitance measured by the number of cells connected to the given cell, i.e., the number of fanouts ("FO number"), and (3) expression (1). The capacitance of the metal wiring is correlated to the chip size of an integrated circuit, i.e., the more metal runs utilized in an integrated circuit, which normally increases with increase in chip size, the larger its capacitance. The FO number can be estimated from the chip size. The output transistor channel width, $W_o$, of the cell is determined by $T_{trans}$, calculated by employing the components mentioned above, and the frequency band limits at which the chip is to be used. In the conventional gate array method, the penetrating current of the cells increases significantly because the input transistors are composed of the same channel width as the output transistors, which is proportionate to $C_L$, with the sum total of the parasitic capacitance on the cell determined as previously mentioned above. As a result, the integrated circuit having a logic cell according to the conventional gate array method requires a significant increase in electric power consumption in order to shorten the switching time of an integrated circuit.

At present, there is an increasing demand for portable electronic apparatus, such as, laptop computers and electronic notebooks that require integrated circuits which operate quickly while consuming little electric power because of the employment of a power source of limited capacity, such as, a battery. However, as previously indicated, it is difficult to realize an integrated circuit employing the cell configuration or structure produced by the conventional gate array method since enhancement of operational speed substantially affects power consumption thereby limiting the usage of battery, powered portable electronic apparatus. Further, it is unrealistic to realize an integrated circuit employing the manual cell design because a significant amount of time is consumed in correction and change of the cell configuration thereby rendering its design cost prohibitive.

It is an object of the present invention to provide a logic cell configuration that permits easy modification of a circuit layout in order to enhance circuit operational speed without significantly sacrificing electrical power consumption.

It is another object of this invention to provide for an improved gate array design method that permits the enhancement of circuit operational speed without significantly increasing electrical power consumption.

SUMMARY OF THE INVENTION

According to this invention, a semiconductor integrated circuit comprises a logic cell composed of insulated gate type transistors of a first and second conductivity type. These transistors are composed of output transistors and input transistors generating signals applied on the output transistors. The transistors are arranged and formed at regular intervals along a power bus. The channel widths of the input and output transistors are formed so that they are substantially at right angles to the power bus and the channel widths, $W_I$ ($W_{IP}$, $W_{IN}$), of the input transistors of the circuit are formed to be narrower than the channel widths, $W_O$ ($W_{OP}$, $W_{ON}$), of the output transistors of the circuit.

When the logic cell includes input transistors connected in series, it is desirable to widen the channel width of the input transistors as the number of serially connected input transistors increases. In this case, it is effective to determine the channel width, $W_I$, of the input transistors by normalizing $W_I$ with $W_I = K$ ($W_O$, n), where K ($W_O$, n) is a correlation function having, as variables, the channel width, $W_O$, of the output transistors and n number of serially connected transistors.

Also, in the manufacturing process of the semiconductor integrated circuit, it is desirable to employ a pattern design, normalized as stated above, as the mask pattern for the input and output transistors.

In the cell design of the present invention, the transistors of the logic cells are formed at regular intervals along the power bus so that they can be easily corrected or changed. Moreover, since the channel widths of the transistors are arranged to be at right angles to the power bus, the channel width of each transistor can be changed without modifying the design interval of the transistors. In a logic circuit designed in this manner, it is possible to reduce the penetrating current, Is, of the input transistors and, in turn, decrease the electric power consumption of the logic cell, as indicated by expression (2), to render the channel width of the input transistors of the cell narrower than the channel width of the output transistors.

On the other hand, relative to the switching time of the logic cell, the parasitic capacitance on the input transistors of the cell, which corresponds to the wiring capacitance of the given cell and the wiring capacitance of the next or adjacent cell, is much smaller than $C_L$, which is the sum total of the parasitic capacitance on the output transistors. In other words, since the switching time of the logic cell is predominantly a function of the heavily loaded output transistor switching time, changes in input transistor switching speed contribute relatively less to the switching time of the logic cell. Accordingly, as shown by the expression (1) above, as the channel width of the input transistors is decreased, the switching time of the input transistors becomes longer. However, since the parasitic capacitance, $C_L$, on the input transistors is small, the increase in switching time of the cell is relatively small. Thus, by rendering the channel width of the input transistors narrower than that of the output transistors, it is possible to form a semiconductor integrated circuit whose switching time is shortened while controlling any increase in the electrical power consumption of the circuit.

In a logic cell where the input transistors are connected in series, the switching time of the input transistors increases as their number, n, connected in series, increases, as supported by expression (1) above. Consequently, it is desirable to modify the channel width of the input transistors according to the increase in number, n, of series connected input transistors within the limits of the channel width of the output transistors to compensate for delay in switching time. Furthermore, by normalizing the channel width, $W_I$, of the input transistors, as modified by the increase of number, n, of series connected input transistors, with a correlation function K ($W_O$, n) having variables, $W_O$, the channel width of the output transistors, and number, n, of series connected input transistors, modification of the mask pattern employed to manufacture the semiconductor circuit board is simplified. In other words, while it is necessary to modify the mask pattern in order to correct for changes in the fabrication of the channel width of cell transistors, by preparing in advance the mask pattern of the transistor with the channel width normalized with the correlation function, K ($W_O$, n), the correction of the mask pattern can be carried out by replacing the mask pattern to be changed with this normalized mask pattern whereby the time necessary for mask pattern change is significantly reduced.

Other objects and attainments together with a fuller understanding of the invention will become apparent and appreciated by referring to the following description and claims taken in conjunction with the accompanying drawings.

BRIEF DESCRIPTION OF THE DRAWINGS

FIG. 1 is a layout showing the structure of a logic cell comprising one embodiment of this invention.

FIG. 2 is a schematic circuit diagram for an OR circuit utilizing different logic cell designs shown in layout form respectively in FIGS. 1, 7 and 8.

FIG. 3 is a layout showing the structure of a logic cell comprising another embodiment of this invention.

FIG. 4 a schematic circuit diagram for an OR circuit utilizing the logic cell of FIG. 3.

FIG. 5 is a plan view showing an external form of the basic cell comprising a transistor of the logic cell shown in FIGS. 1 and 3.

FIG. 6 logic circuit diagram of a circuit having a multi-stage input and intermediate transistors.

FIG. 7 is a plan view showing the structure of a logic cell for an OR circuit formed by using the conventional gate array method.

FIG. 8 is plan view showing the structure of a logic cell for an OR circuit formed by using the conventional manual design method.

DESCRIPTION OF THE PREFERRED EMBODIMENTS

Reference is now made to FIG. 1 which shows the layout configuration or structure of a logic cell for forming an integrated circuit having insulated gate type transistors fabricated according to the teachings of this invention. The logic circuit shown in FIG. 1 is the OR circuit shown in FIG. 2. Pch-Tr input transistors 101, 102, output transistor 105, Nch-Tr input transistors 111, 112 and output transistor 115 are formed in a P well and are arranged at regular intervals, L, along power buses 141 and 142, which respectively provide supply source potential, $V_{DD}$, and ground potential, $V_{SS}$. These transistors 101–115 are arranged so that the respective channel widths, $W_{IP}$, $W_{OP}$, $W_{IN}$ and $W_{ON}$, may be at right angles relative to power buses 141 and 142. Two input signals are provided on series connected Pch-Tr input transistors 101 and 102 and on parallel connected Nch-Tr transistors 111 and 112 through input terminals 131 and 132 via gate electrodes 120. The outputs of these input transistors are applied at node 104 to the gates of Pch-Tr output transistor 105 and Nch-Tr output transistor 115. The drains of these two transistors are connected to output terminal 135 via metal wiring 143. In this manner, the circuit layout comprising polysilicon gate electrodes 120, metal wiring 143, input terminals 131 and 132, output terminal 135 and contacts 145 constitute the logic circuit shown in FIG. 2.

As shown in FIG. 1, the channel widths, $W_{IP}$, $W_{IN}$, are respectively smaller than the channel widths, $W_{OP}$, $W_{ON}$. The interval, L, is determined by a design rule particular to the process and in this particular embodiment, has a value of 5 μm. The channel width, $W_{OP}$, of the Pch-Tr output transistor and the channel width, $W_{ON}$, of the Nch-Tr output transistor are determined from an estimation of the parasitic capacitance of the metal interconnect wiring relative to the output of the logic cell and the FO number. In particular circumstances here, $W_{OP}$ is 20 μm and $W_{ON}$ is 12 μm. On the other hand, the channel width, $W_{IP}$, of the Pch-Tr input transistors is 12 μm, while the channel width, $W_{IN}$, of the Nch-Tr input transistors is 4 μm.

The penetrating current, $I_S$, of the Pch-Tr input transistors can be calculated employing the previously stated expression (2) as follows:

$$I_S = 1/8 \cdot \beta_{PO} \cdot W_{IP}/n \cdot (V_{DD} - 2 \times V_{th})^2 \quad (3)$$
$$= 1/8 \cdot 15 \, \mu m \cdot 12/2 \cdot (5 - 2 \times 0.5)^2$$
$$= 180 \, \mu A$$

where the amplification factor of the electrical current, $\beta_{PO}$, of the Pch-Tr input transistors per unit length is 15 μA/V²/μm, the source potential, $V_{DD}$, is 5 V, the threshold voltage $V_{th}$ is 0.1·$V_{DD}$. On the other hand, as shown in FIG. 7, the penetrating current, $I_P$, of the Pch-Tr input transistors, whose channel width, $W_{IP}$, of the input transistors is 20 μm, the same as the channel width, $W_{OP}$, of the output transistors, can be calculated as follows:

$$I_S = 1/8 \cdot 15 \, \mu m \cdot 20/2 \cdot (5 - 2 \times 0.5)^2 \quad (4)$$
$$300 \, \mu A$$

In this manner, the penetrating current, $I_S$, can be reduced a substantial amount, in this particular instance about 40% compared to previously explained conventional structures.

The delay time of the logic cell from input to output may be expressed as follows:

$$Tdr = Tif + Tor$$
$$Tdf = Tir + Tof \quad (5)$$

where Tdr and Tdf are, respectively, the delay times of the rise and fall from input to output of the logic cell. Tif and Tir are, respectively, the delay times of the fall and rise of the input transistors; Tor and Tof are, respectively, the delay time of the rise and fall of the output transistors. The delay time of each of the transistors is expressed by the transition period, $t_r$, and the delay time, $T_O$, of a transistor. Assuming that the delay times of each of the transistors are the same, the delay time of rise, Tdf, is as follows:

$$Tdf = t_r + t_r + 3 \cdot T_O \quad (6)$$

Introducing the approximated expression (1) of the transition period, Tdf may be expressed as follows:

$$Tdf = 4 \cdot C_I/(\beta_{PO} \cdot W_{IP}/n \cdot V_{DD}) + \quad (7)$$
$$4 \cdot C_L/(\beta_{NO} \cdot W_{OP}/n \cdot V_{DD}) + 3 \cdot T_O$$

where $C_I$ is the parasitic capacitance on the input transistors and is the sum of the wiring capacitance in a given cell and the wiring capacitance of a next cell. $C_L$ is the sum total of the parasitic capacitance on the output transistors as well as the sum total of the capacitance of the metal wiring interconnects between a given cell and the next cell and the parasitic capacitance on the output of the given cell as measured by the number of cells connected to the given cell, i.e., the FO number. $\beta_{NO}$ is the amplification factor of the electric current of the Nch-Tr input transistors per unit length and is 30 μA/V²/μm. For example, if $C_I$ is 0.1 pF, $C_L$ is 1 pF, $T_O$ is 0.3 ns, and using the value of the amplification factor of the electric current, $\beta_{PO}$, of the Pch-Tr input transistors, 15 μA/V²/μm and the value of the source potential, $V_{DD}$, 5 V, Tdf can be calculated from expression (7) as follows:

$$Tdf = 4 \cdot 0.1/(15 \ \mu m \cdot 12/2 \times 5) + \qquad (8)$$
$$4 \cdot 1.0/(30 \ \mu m \cdot 12/1 \times 5) +$$
$$3 \cdot 0.3$$
$$= 4.0 \ ns$$

where the channel width, $W_{IP}$, of the Pch-Tr input transistors is 12 μm and the channel width, $W_{ON}$, of the Nch-Tr output transistors is also 12 μm.

On the other hand, in the configuration or structure of a conventional logic cell shown in FIG. 7, the channel width, $W_{IP}$, of the Pch-Tr input transistors is 20 μm, the same as the channel width, $W_{OP}$, of the output transistors. Thus, making the same calculations as made above:

$$Tdf = 4 \times 0.1/(15 \ \mu m \times 20/2 \times 5) + \qquad (9)$$
$$4 \times 1.0/(30 \ \mu m \times 12/1 \times 5) +$$
$$3 \times 0.3$$
$$= 3.6 \ ns$$

it is seen that the delay time is reduced by about 10%. In the expressions (8) and (9), however, $C_I/C_L$ is about 0.1 but is relatively small in an actual integrated circuit implementation. Accordingly, this disparity of the delay time is smaller than the above calculated numerical value. In this manner, the logic cell produced as one instance of this invention can be expected to achieve about the same delay as that of the logic cell of the conventional structure while correspondingly controlling the increase of electrical power consumption.

FIG. 6 represents a more complicated circuit to which the present invention may be applied. The circuit shown is basically a combination one bit latch coupled to a single stage shift register. The one bit latch comprises transmission circuits 507 and 508, inverters 501, 502 and 508, and NAND gate 511. The single stage shift register comprises transmission circuits 509 and 510, NAND gate 512 and inverters 504, 505 and 506. In the circuit here, input circuits comprise inverter 501, transmission circuit 507, and NAND gates 511 and 512. Intermediate circuits comprise inverters 502, 503 and 506, and transmission circuits 509 and 510. Output circuits comprise inverters 516 and 517. In the case of a logic cell configuration for achieving the more complicated circuit design, such as shown in FIG. 6, which contains intermediate transistors for intermediate logic and signals, in addition to input transistors treating only input signals, the penetrating current, $I_s$, of the intermediate transistors can be reduced with narrower channel widths. Moreover, the delay time of the transistors receiving input signals can be shortened to about the same as that of the cell of the conventional structure since the parasitic capacitance is reduced on the input transistors.

Thus, this invention may be applied to a logic cell relative to the fabrication of a more complex integrated circuit by providing the cell with a shortened delay time while controlling an increase in electrical power consumption. By narrowing the channel width of prescribed transistors, the charging and discharging current and the short circuit current inside the cell are reduced. As a result, it can be anticipated that the electrical power consumption of an integrated circuit chip will be reduced by about half of that of a conventional type integrated circuit chip.

FIG. 3 shows a layout of a logic cell for a three input OR circuit, schematically illustrated in FIG. 4, as another example of this invention. In this OR circuit, the Pch-Tr input transistors 101, 102 and 103 are connected in series. As a result, a line of input transistors are added in the structure of the logic cell and there are three separate input lines for input transistors. Furthermore, the channel width, $W_{IP}$, of the input transistors is 15 μm, which is larger than the channel width, $W_{IP}$, of the logic cell in FIG. 1. The other aspects of the configuration are the same as in the case of the logic cell of FIG. 1 so that their explanation is not repeated here and is incorporated by reference to the description of FIG. 1. The channel width, $W_{IP}$, is larger than that of the logic cell in FIG. 1 to compensate for the increase of the transition period, $t_r$. Since the transition period, $t_r$, is inversely proportional to $\beta_{PO} \cdot W_{IP}/n$, as shown in expression (1), the transition period will increase as n increases. In the case of FIG. 3, n has been increased by one over the embodiment of FIG. 1, i.e., n=3. Therefore, it is desirable to increase the channel width of the input transistors 101–103, 111–113 within the limits of that of the output transistors 105, 115 as the number, n, of the input transistor series is increased. Furthermore, in this particular situation, a transistor is formed by normalizing input transistor channel width, $W_{IP}$, relative to the following correlation function:

$$W_{OP} = k(n) \cdot W_{IP} \qquad (10)$$

where k(n) is a correlation coefficient and is 2.5 when n=1; is 1.67 when n=2; is 1.25 when n=3; and is 1.0 when n=4. It should be noted in this connection that the coefficient is set assuming that the maximum number of the series is 4, but that this coefficient can be changed depending on such factors as the maximum number of the series. However, if the number in the series is increased above 4, there is a possibility that the circuit delay time will sharply increase so that in such cases, high speed circuit operation may not be achieved. The following Table 1 illustrates explicit examples as to normalizing input transistor channel width relative to the above mentioned correlation function.

TABLE 1

| | When Output Pch = 20μ Nch = 12μ | | | | When Output Pch-Tr = 16μ Nch-Tr = 9μ | |
|---|---|---|---|---|---|---|
| No. of series Connected Transistors | Pch-TrW | Nch-TrW | $K_P(n)$ | $K_N(n)$ | $K_P(n)$ | $K_N(n)$ |
| 1 | 8μ | 4.5μ | 2.4 | 2.7 | 2.0 | 2.0 |
| 2 | 15μ | 7μ | 1.3 | 1.7 | 1.1 | 1.3 |
| 3 | 19μ | 12μ | 1 | 1 | 0.8 | 0.75 |
| 4 | 19μ | 12μ | 1 | 1 | 0.8 | 0.75 |

In employing the expression (10), the Pch-Tr's transistors of each size are normalized to basic cell configurations 405–408 shown in FIG. 5. In FIG. 5, in basic cell 405, $W_{IP}$ is 8 μm when n=1; in basic cell 406, $W_{IP}$ is 12 μm when n=2; in basic cell 407, $W_{IP}$ is 16 μm when n=3; and in basic cell 408, $W_{IP}$ is 20 μm when n=4 and it also serves as the basic cell for the output transistors. Configurations 405–408 serve as channel, source or drain for Pch-Tr's and configurations 416–419 serve as channel, source or drain for Nch-Tr's. Configurations 401–404 serve as source and drain of Pch-Tr's and configurations 411-415 serve as source and drain of Nch-Tr's. Configurations 421-424 are gate electrode configurations of Pch-Tr's and configurations 425-426 are gate electrode configurations of Nch-Tr's. There are four kind of gate configurations for Pch-Tr's and only two kind of gate configurations for Pch-Tr's since the channel width for Nch-Tr's is varied little. In this connection, electrode configuration 426 is utilized with channel configuration 419 whereas electrode configuration 425 is utilized with channel configurations 416-418. By utilizing these basic cell configurations for the design of a logic cell, it is possible to select a corresponding cell among the cells prepared in advance in order to change the logic cell configuration to reduce switching time. Thus, in the manufacturing process of a mask pattern employed in producing a semiconductor integrated circuit, it is possible to prepare a mask pattern corresponding to the foregoing basic cell configurations. When the structure of the logic cell is changed, the change can be easily and flexibly incorporated because the mask pattern can be easily formed in a short period of time by employing a prepared mask pattern according to these cell configurations.

Thus, the method of gate array structure of this invention provides for forming the transistors of the logic cells comprising the gate array along the power bus, $V_{DD}$, and forming the channel width of the input transistors to be narrower than the channel width of the output transistors of the cell. In this manner, the operational speed of the integrated circuit can be increased while controlling, that is, reducing the effect of corresponding substantial increase the electrical power consumption of the circuit, compared to that of conventional logic cell configurations. With a reduced electrical power consumption, the integrated semiconductor circuit of the structure of this invention is highly suitable for portable type, electronic devices and apparatus of limited power supply capacity, such as found in laptop computers, electronic notebooks and other such portable electronic devices. Furthermore, by forming a logic cell with a basic cell with a channel width of the transistors normalized to the above discussed correlation function, the correction to the cell configuration of the structure of the logic cell can be accomplished in a much quicker and easier manner.

While the invention has been described in conjunction with several specific embodiments, it is evident to those skilled in the art that many further alternatives, modifications and variations will be apparent in light of the forgoing description. For example, in the above described embodiments of this invention, the gate electrode employed comprises polysilicon but other suitable gate electrode materials may be employed, such as, metal. Neither the arrangement interval, L, nor each channel width, W, need be specified and the correlation function K ($W_O$, n) is not a fixed value. Furthermore, the Pch-Tr and Nch-Tr may be reversed and the well domain may be on the Pch side. Also, the logic circuit formed with the practice of this invention can be naturally applied to other types of logic circuit and is not limited to just the OR circuit examples illustrated herein. Lastly, while this invention is illustrated relative to insulated gate type transistors of a first and second conductive type, the principal of this invention is not limited to this particular transistor type, but is applicable to other transistor types wherein the expressions set forth in this application are equally applicable, at least in their principal of theory. Thus, the invention described herein is intended to embrace all such alternatives, modifications, applications and variations as fall within the spirit and scope of the appended claims.

What is claimed is:

1. A semiconductor integrated circuit having an internal logic cell of insulated gate type transistors of a first conductive type and insulated gate type transistors of a second conductive type, said transistors comprising output transistors and input transistors producing signals which are applied to said output transistors, said transistors being formed at a regular interval along a power bus so that the channel widths of said output and input transistors may be at right angles to the elongated length of said power bus, the channel width of said input transistors narrower than the channel width of said output transistors and wherein the channel lengths of said output and said input transistors are substantially the same.

2. The semiconductor integrated circuit of claim 1 wherein said input transistors of said logic cell are connected in series and the channel width of said input transistors is increased as the number of said serially connected transistors in said logic cell is increased.

3. The semiconductor integrated circuit of claim 2 wherein the channel width, $W_{IP}$, of said input transistors is defined on the basis of a correlation function having variables comprising the channel width, $W_{OP}$, of said output transistors and the number of said serially connected input transistors.

4. The semiconductor integrated circuit of claim 3 wherein said correlation function is $W_{OP} = k(n) \cdot W_{IP}$ where k(n) is a correlation coefficient and n is the number of serially connected input transistors in said logic circuit.

5. A logic cell configuration formed into circuit logic including input and output transistors of the first and second conductive type, said transistors being formed at a regular interval along a power bus so that the channel widths of said transistors may be at right angles to the elongated length of said power bus, the channel width, $W_{IP}$, of said input transistors defined on the basis of a correlation function $W_{OP} = k(n) \cdot W_{IP}$, where k(n) is a correlation coefficient and n is the number of serially connected input transistors in said logic cell having variables comprising the channel width, $W_{OP}$, of said output transistors and the number of serially connected input transistors and wherein the channel lengths of said output and said input transistors are substantially the same.

* * * * *